(12) United States Patent
Tamaki

(10) Patent No.: US 6,311,315 B1
(45) Date of Patent: Oct. 30, 2001

(54) SEMICONDUCTOR INTEGRATED CIRCUIT, DESIGN METHOD AND COMPUTER-READABLE RECORDING MEDIUM

(75) Inventor: Tokuhiko Tamaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/435,813

(22) Filed: Nov. 8, 1999

Related U.S. Application Data

(62) Division of application No. 08/927,069, filed on Sep. 10, 1997.

(30) Foreign Application Priority Data

Sep. 12, 1996 (JP) .................................. 8-241698

(51) Int. Cl.⁷ ..................................... G06F 17/50
(52) U.S. Cl. ............................................. 716/7
(58) Field of Search ................... 29/830; 716/7

(56) References Cited

U.S. PATENT DOCUMENTS

| | | | |
|---|---|---|---|
| 5,410,490 | 4/1995 | Yastro | 364/488 |
| 5,727,310 * | 3/1998 | Casson | 29/830 |

FOREIGN PATENT DOCUMENTS

| | | |
|---|---|---|
| 3-289155 | 12/1991 | (JP) . |
| 4-107953 | 4/1992 | (JP) . |

OTHER PUBLICATIONS

K. Hiraoka et al., "The Enhancement of Electromigration Lifetime under High Frequency Pulsed Conditions", IEICE Trans. Fundamentals, vol. 377–A, No. 1, pp. 195–203 (Jan. 1994).

R. G. Filippi et al., "The Effect of Copper Concentration on the Electromigration Lifetime of Layered Aluminum–Copper (Ti–AlCu–Ti) Metallurgy with Tungsten Diffusion Barriers", Proc. of IEEE, VMIC Conf., 1992, pp. 359–365.

T. Aoki et al., "Permitted Electromigration of TungstenPlug Vias In Chain For Test Structure With Short InterPlug Distance", Proc. of IEEE, VMIC Conf., 1994, pp. 266–272.

H. Kawasaki et al., "An Electromigration Failure Model of Tungsten Plug Contacts/Vias For Realistic Lifetime Prediction", Proc. of IEEE, Symposium on VLSI Technology, 1996, pp. 192–193.

* cited by examiner

*Primary Examiner*—Matthew Smith
*Assistant Examiner*—Thuan Do
(74) *Attorney, Agent, or Firm*—McDermott, Will & Emery

(57) ABSTRACT

A first to fifth plugs provide interconnection between each transistor and a first metallic interconnection layer. A sixth to eighth plugs provide interconnection between the first metallic interconnection layer and a second metallic interconnection layer. The total opening area of a connecting window including at least one connecting hole (or the number of connecting holes) is designed in a smaller zone when the type of electric current (waveform) is a bidirectional-directional current, when the flow direction of electric current is from a plug to an interconnection line, when the length of interconnection line is long, or when the width of interconnection line is small. Such arrangement makes it possible to achieve a reduction of the area occupied by interconnections by performing layout design allowing for the permissible electric current amount, without having to prepare complicated tables or without having to perform huge amounts of arithmetic processing. As a result, the interconnection area can be reduced, and fine, high-density semiconductor integrated circuits can be fabricated.

21 Claims, 7 Drawing Sheets

SEMICONDUCTOR INTEGRATED CIRCUIT, DESIGN METHOD AND COMPUTER-READABLE RECORDING MEDIUM

This application is a divisional of application Ser. No. 08/927,069 filed Sep. 10, 1997.

BACKGROUND OF THE INVENTION

This invention relates to a semiconductor integrated circuit that comprises a plurality of interconnection layers and to a method of designing such a semiconductor integrated circuit. The present invention pertains in particular to achieving a reduction of the area occupied by interconnection lines in order to increase the level of integration of the semiconductor integrated circuit.

With the rapid improvement in the level of semiconductor integrated circuit integration, reduction in interconnection line area and increase in high electric current density are problems the semiconductor industry will have to face in the near future. In recent years, various approaches, for example, to interconnection line materials with high electromigration (hereinafter referred to as "EM") resistance, new semiconductor device structures, and layout design techniques allowing for the EM resistance have been proposed, have been made.

As an interconnection line material, a copper- or titanium-added aluminum alloy is currently used for semiconductor integrated circuits. A structure (called the "plug structure") is adopted, more specifically tungsten (W) is filled into a contact hole or into a via hole by means of an LPCVD (low-pressure chemical vapor deposition) process for establishing electrical continuity between interconnection lines of vertically disposed interconnection layers constructed of an aluminum alloy.

Various layout design techniques have been proposed. Japanese patent applications, which have been laid open under publication nos. 3-289155 and 4-107953, respectively, each disclose a layout design technique in which the waveforms and values of electric currents which flow in individual interconnection lines are extracted by arithmetic operations for reflection on the layout.

The fact that the EM depends upon the current density, upon the interconnection line width, and upon the current waveform has been known to exist (see "The Enhancement of Electromigration Lifetime under High Frequency Pulsed Conditions," IEICE Trans. Fundamentals, Vol. E77-A, No. 1, p.195, 1994 by K. Hiraoka and others). Additionally, faulty mode, in which voids are produced due to electromigration in an aluminum alloy overlying a plug structure of tungsten, has lately attracted considerable attention (see "The Effect of Copper Concentration on the Electromigration Lifetime of Layered Aluminum-Copper (Ti—AlCu—Ti) Metallurgy with Tungsten Diffusion Barriers," Proc. of IEEE, VMIC, p.359, 1992 by R. G. Filippi and others). Further, it has been proved that EM in an aluminum alloy overlying a tungsten-plug depends upon the interconnection line length (see "Permitted Electromigration of Tungsten-plug Vias in Chain for Test Structure with Short Inter-plug Distance," Proc. of IEEE, VMIC, p.266, 1994 by T. Aoki and others). Furthermore, the fact that the EM depends upon the overlap margin (reservoir length) of aluminum interconnection line and tungsten-plug has been known to exist (see "An Electromigration Failure Model of Tungsten Plug Contacts/Vias for Realistic Lifetime Prediction, "VLSI Symp. p.192, 1996 by H. Kawasaki and C. K. Hu).

TABLE 1

| | LIFE ITEM (EM RESISTANCE) | |
|---|---|---|
| PARAMETERS | SHORT | LONG |
| 1. CURRENT DENSITY | HIGH | LOW |
| 2. LINE WIDTH | ABOVE GRAIN SIZE | BELOW GRAIN SIZE |
| 3. CURRENT DIRECTION | LINE→V i a | V i a→LINE |
| 4. LINE LENGTH | LONG | SHORT (BELOW 5 μm) |
| 5. CURRENT WAVEFORM | DC | DC PULSE   AC |
| 6. OVERLAP MARGIN | SHORT | LONG |

Table 1 above is a list showing the foregoing parameters having affection on the electromigration, and the tendency of such affection. Integrating the foregoing prior art techniques, it is conceptually possible to incorporate the dependence of the electromigration upon the parameters shown in Table 1 into the foregoing Japanese patent applications. However, Incorporation of a single EM dependence parameter Into such a technique requires a process of verifying millions of interconnection lines. Further, providing corresponding tables to the parameters and verifying interconnection lines is enormously time-consuming and is impractical at all. Accordingly, these techniques have not been put into practical use yet. Practically, design rules allowing for conditions when the worst happens are applied to all interconnection lines. For example, in Japanese patent application pub. no.4-107953 which utilizes current values, an estimation of the maximum permissible current density at a point under worst condition Is formed. For example, if the maximum permissible electric current of an interconnection line having a width of 1 micrometer is determined at 1 milliampere, then it is determined such that an interconnection line having a width of 2 micrometers is formed at a point at which an electric current of 2 milliampere flows. Since maximum permissible current density needed at a point under the worst condition is applied to all locations, safety factor more than necessary is incorporated. As a result, although the miniaturization of individual semiconductor elements advances. it is difficult to achieve a reduction of the interconnection line dimensions therefore producing a bar to improving the level of semiconductor integrated circuit integration.

SUMMARY OF THE INVENTION

Accordingly, it is a first object of the present invention to provide a high-density semiconductor integrated circuit and a method for designing such a semiconductor integrated circuit to the miniaturization of semiconductor elements. More specifically, based on the knowledge that the affects of the interconnection on EM vary depending upon the working conditions of individual interconnection lines even at an identical amount of electric current. Parameters, which have important affects on EM, are selected from interconnection working conditions. The interconnection line form is determined in relation to these parameters. Within a range which does not affect the EM resistance, the dimensions of interconnection lines are reduced as small as possible.

In order to achieve the first object, the present invention provides semiconductor integrated circuits and a recording medium.

Overlap margins, needed for interconnection lines, are also a bar to achieving a reduction of the interconnection line dimensions and a bar to providing high-density semiconductor integrated circuits.

It is a second object of the present invention to provide a high-density semiconductor integrated circuit and a method for designing such a semiconductor integrated circuit to the miniaturization of semiconductor elements. More specifically, based on the knowledge that even if the plug position and the interconnection line position slightly differ from each other, this will not affect EM when an electric current flowing the plug is very small. The overlap margin is reduced according to the electric current flowing in plugs.

In order to achieve the second object, the present invention provides semiconductor integrated circuits and a recording medium.

The present invention provides a design method for a semiconductor integrated circuit having components formed in a semiconductor substrate, a plurality of interlayer dielectric films and a plurality of interconnection layers alternately formed over said semiconductor substrate, and plugging members of a conductive material which are filled in a plurality of connecting windows each including at least one connecting hole formed through said interlayer dielectric film wherein said plugging member provides interconnection between interconnection lines which belong in different interconnection layers or interconnection between an interconnection line which belongs in an interconnection layer and a component, said semiconductor integrated circuit design method comprising:

(a) a first step including:
  selecting, as a parameter which affects electromigration resistance at the interface between an interconnection line and a plugging member, a specific parameter including at least one of an electric current direction, an electric current waveform, an interconnection line material, a plugging member material, an interconnection line length, an interconnection line width, an interconnection line area, an interconnection line capacity, an interconnection line thickness, and an overlap margin;
  dividing, according to a working condition relative to said specific parameter, the permissive current amount of a plugging member into a plurality of zones; and
  performing the setting of a representative value common in each of said zones; and
(b) a second step including:
  determining the representative value of one of said zones to the value of said specific parameter as the permissible current amount of said plugging member; and
  determining the total opening area of each said connecting window and the plane form of each said interconnection line according to said permissible current amount.

A permissive current amount, allowing for the dependence of EM on various types of parameters, is found. According to the permissive current amount, the total opening area of a connecting window including one or more connecting holes is divided into a plurality of zones. Such arrangement makes it possible to easily achieve a reduction of the area occupied by interconnections within the range that does not affect EM resistance, without having to prepare complicated tables or without having to perform huge amounts of arithmetic processing. As a result, higher-density semiconductor integrated circuits can be fabricated.

It is preferred that in said second step said semiconductor integrated circuit is subjected to schematic placement/interconnection before the determination of said permissible current amount, the total opening area of each said connecting window is determined according to a permissible current amount determined based on the result of said placement/interconnection, and the form of each said interconnection line is corrected according to said total opening area of each said connecting window.

As a result of such arrangement, the correct value of a specific parameter can be determined from a layout obtained by a schematic placement/interconnection process. This enables the design of a layout with the exact total opening area of a connecting window including at least one connecting hole and the fine form of interconnection.

It is preferred that the semiconductor integrated circuit design method further comprises, at least before said second step, a step of subjecting said semiconductor integrated circuit to placement/interconnection wherein in said second step when the total opening area of each said connecting window determined according to the result of said placement/interconnection disagrees with said working condition said placement/interconnection performed is corrected.

The degree of allowance is set small in advance and placement and interconnection is carried out. This makes it possible to check whether the total opening area of a connecting window including at least one connecting hole determined by the placement/interconnection agrees with the working condition, to correct the placement/interconnection.

It is preferred that the approximate capacity of each said interconnection line is predetermined and that in said first step an approximate interconnection line capacity is included in said specific parameter and the representative value of a zone having an approximate interconnection line capacity below a given capacity is set in such a way as to exceed the representative value of a zone having an approximate interconnection line capacity above said given capacity.

It is preferred that the length of each said interconnection line is predetermined and that in said first step an interconnection line length is included in said specific parameter and the representative value of a zone having an interconnection line length below a given value is set in such a way as to exceed the representative value of a zone having an interconnection line length above said given value.

When the interconnection line capacity is great, the metallic atoms from the interface of a plugging member and an interconnection line can diffuse easily. This accelerates electromigration. On the other hand, when the interconnection line length is short, the resistance against the movement of metallic atoms is enhanced. As a result, the phenomenon of electromigration becomes unlikely to occur. Taking into account these facts, the total opening area of a connecting window including one or more connecting holes which are brought in connection with an interconnection line whose approximate capacity is small or whose length is short, is reduced. It accordingly becomes possible to reduce the dimensions of interconnection lines according to the reduction of the total window opening area. Generally speaking, as elements are reduced in size, the interconnection line length is likewise reduced. The enables the provision of higher-density semiconductor integrated circuits to semiconductor integrated circuit miniaturization.

It is preferred that the approximate width of each said interconnection line is predetermined and that in said first step an approximate interconnection line width is included in said specific parameter and the representative value of a zone having an approximate interconnection line width below a given value is set in such a way as to exceed the representative value of a zone having an approximate interconnection line width above said given value.

When the approximate width of an interconnection line is decreased, this results in a so-called "bamboo structure" in which the grain boundaries of a metal constructing the interconnection line exist only in the interconnection line width direction or results in a structure similar to the bamboo structure. Since there exist no grain boundaries in the interconnection line direction (even if there exist grain boundaries the degree of the existence is negligible), the phenomenon of electromigration is unlikely to occur. In accordance with this design method, the total opening area of a connecting window having one or more connecting holes which are brought in connection with interconnection lines having such a structure can be reduced. Correspondingly to this, it becomes possible to achieve a reduction of the area occupied by interconnection. Generally speaking, as elements are reduced in size, the interconnection line width is likewise reduced. The enables the provision of higher-density semiconductor integrated circuits to semiconductor integrated circuit miniaturization.

It is preferred that the length and the approximate width of each said interconnection line are predetermined and that in said first step both an interconnection line length and an approximate interconnection line width are included in said specific parameter and the representative value of a zone having an interconnection line length and an approximate interconnection line width, at least one of which falling below a corresponding one of given values, is set in such a way as to exceed the representative value of a zone having an interconnection line length and an approximate interconnection line width, both of which exceeding said given values.

It is preferred that it is predetermined whether the waveform of an electric current that flows in a plugging member is a unidirectional current or a bidirectional current and that in said first step an electric current waveform is included in said specific parameter and the representative value of a zone in which a bidirectional electric current flows is set in such a way as to exceed the representative value of a zone in which a unidirectional electric current flows.

In a bi-directional electric current which flows In each direction, the direction in which atoms move alternately changes, whereby the metallic atoms near the interface of a plugging member and an interconnection line make little movement. Taking this into account, the total opening area of a connecting window having at least one connecting hole through which a bi-directional electric current flows can be reduced. Accordingly, a reduction of the interconnection line area can be achieved.

It is preferred that It is determined whether a unidirectional current waveform is a pulse current or a continuous current and that in said first step a unidirectional current waveform is included in said specific parameter and the permissible current of a zone in which said unidirectional current is a pulse current is set in such a way as to exceed the permissible current of a zone in which said unidirectional current is a continuous current.

If the electric current value is the same, the number of electrons that move is greater in electric current which flows in only one way in pulse-like manner in comparison with a continuous electric current and the movement of metallic atoms is unlikely to occur. Taking this into account, the total opening area of a connecting window having at least one connecting hole can be reduced. Accordingly, a reduction of the interconnection line area can be achieved.

It is preferred that the direction of an electric current which flows between a plugging member and an interconnection line is predetermined and that in said first step an electric current flow direction is included in said specific parameter and the permissible current of a zone in which an electric current flows from a plugging member to an interconnection line is set in such a way as to exceed the permissible current of a zone in which an electric current flows in the opposite direction.

Where the electric current flow direction is from plugging member to interconnection line, the electrons move in the opposite direction (from line to plug), there is made little movement of the near-interface metallic atoms. Taking this into account, the total opening area of a connecting window having at least one connecting hole can be reduced. Accordingly, a reduction of the interconnection line area can be achieved.

It is preferred that it is predetermined that pMISFETs and nMISFETs are mounted, as said components, in said semiconductor substrate and that said current flow direction is decided by whether said component is a pMISFET or an nMISFET.

It is preferred that the basic dimensions of said connecting holes are unified and that in said step of determining the total opening area of each said connecting window the number of connecting holes is determined.

Accordingly, this design method simplifies the processing of design of connecting holes.

The present invention provides a design method for a semiconductor integrated circuit having components formed in a semiconductor substrate, a plurality of interlayer dielectric films and a plurality of interconnection layers alternately formed over said semiconductor substrate, and plugging members of a conductive material which are filled in a plurality of connecting windows each Including at least one connecting hole formed through said interlayer dielectric film wherein said plugging member provides interconnection between interconnection lines which belong in different interconnection layers or interconnection between an interconnection line which belongs in an interconnection layer and a component, said semiconductor integrated circuit design method comprising:

(a) a first step including:
   selecting, as a parameter which affects electromigration resistance at the interface between an interconnection line and a plugging member, a specific parameter including at least one of an electric current amount, an electric current direction, an electric current wave form, an interconnection line material, a plugging member material, an interconnection line length, an interconnection line width, an interconnection line area, an interconnection line thickness, and an interconnection line capacity;
   dividing, according to a working condition relative to said specific parameter, the overlap margin between an interconnection line and a connecting window into a plurality of zones; and
   performing the setting of a representative value common in each of said zones; and (b) a second step including:
   determining the representative value of one of said zones to the value of said specific parameter as the overlap margin between each said interconnection line and each said connecting hole.

This design method makes it possible to provide a reduction of the overlap margin (the reservoir length) of connecting windows and interconnection lines within the range that does not affect electromigration. Accordingly, a reduction of the interconnection line area can be achieved.

It is preferred that determination of an overlap margin in said second step is carried out after subjecting said semiconductor integrated circuit to schematic placement/ interconnection and finding the value of said specific parameter from the result of said schematic placement/ interconnection and that said semiconductor integrated circuit design method further comprises, after said overlap margin determination, a step of correcting said schematic placement/interconnection according to said overlap margin.

In accordance with this design method, the exact value of a specific parameter is determined from a layout produced by schematic placement and interconnection for correct determination of an overlap margin at strict allowance. This enables the design of a layout in which the interconnection line form is appropriate and fine.

It is preferred that the semiconductor integrated circuit design method further comprises, at least before said second step, a step of subjecting said semiconductor integrated circuit to placement/interconnection and that in said second step when the overlap margin between an interconnection line and a connecting window determined according to the result of said placement/interconnection disagrees with said working condition said placement/interconnection performed is corrected.

The degree of allowance is set small in advance and placement and interconnection is carried out. This makes it possible to check whether the total opening area of a connecting window including at least one connecting hole determined by the placement/interconnection agrees with the working condition, to correct the placement/ interconnection.

It is preferred that the length of each said interconnection line is predetermined and that in said first step an interconnection line length is included in said specific parameter and the representative value of a zone having an interconnection line length below a given value is set in such a way as to fall below the representative value of a zone having an interconnection line length above said given value.

It is preferred that the approximate width of each said interconnection line is predetermined and that in said first step an approximate interconnection line width is included in said specific parameter and the representative value of a zone having an approximate interconnection line width below a given value is set in such a way as to fall below the representative value of a zone having an approximate interconnection line width above said given value.

It is preferred that in said first step the current density of an electric current flowing in a plugging member is included in said specific parameter and that the representative value of a zone is set to decrease as the current density of a plugging member of said zone increases.

It is preferred that in said first step said common representative values are set such that a zone in which an electric current flowing between an interconnection line and a plugging member is a continuous and unidirectional current, a zone in which said electric current is a unidirectional and pulse-like current, and a zone in which said electric current is a bidirectional current are assigned respective representative values which are set to increase in that order.

It is preferred that it is determined whether the waveform of said unidirectional current is a pulse current or a continuous current and that in said first step a unidirectional current waveform is included in said specific parameter and the representative value of a zone in which said unidirectional current is a pulse current is set in such a way as to fall below the representative value of a zone in which said unidirectional current is a continuous current.

It is preferred that the direction of an electric current which flows between a plugging member and an interconnection line is predetermined and that in said first step an electric current direction is included in said specific parameter and the representative value of a zone in which an electric current flows from a plugging member to an interconnection line is set in such a way as to fall below the representative value of a zone in which an electric current flows in the opposite direction.

Accordingly, a further reduction of the overlap margin is possible to achieve under working conditions which do not affect electromigration with respect to each of the foregoing parameters.

The present invention provides a semiconductor integrated circuit comprising:
  components formed in a semiconductor substrate;
  a plurality of interlayer dielectric films and a plurality of interconnection layers, said interlayer dielectric films and said interconnection layers being formed in alternating manner over said semiconductor substrate; and
  plugging members of a conductive material which are filled in a plurality of connecting windows each including at least one connecting hole formed through said interlayer dielectric film;
  wherein:
    said plugging member provides interconnection between interconnection lines which belong in different interconnection layers or interconnection between an interconnection line which belongs in an interconnection layer and a component; and
    the total opening area of each said connecting window and the plane form of each said interconnection line are set such that each of zones, which result from division according to a specific parameter including at least one of an electric current direction, an electric current waveform, an interconnection line material, a plugging member material, an interconnection line length, an interconnection line width, an interconnection line area, an interconnection line capacity, an interconnection line thickness, and an overlap margin at an interconnection line-plugging member interface, has a common total connecting window opening area and a common interconnection line plane.

Within the range that does not affect the electromigration resistance, the formation of connecting windows and interconnection lines are performed in order that the total connecting window opening area may belong in a small zone, and the interconnection line area can be reduced. Additionally, as described above, design, capable of realizing such a structure, is easy to perform. The cost of fabricating semiconductor integrated circuits is held within a practically permissive range.

With respect to the semiconductor integrated circuit of the present invention, corresponding manners to cases in which the specific parameter includes, for example, the electric current density, may be employed.

The present invention provides a semiconductor integrated circuit comprising:
  components formed in a semiconductor substrate;
    a plurality of interlayer dielectric films and a plurality of interconnection layers, said interlayer dielectric films and said interconnection layers being formed in alternating manner over said semiconductor substrate; and
    plugging members of a conductive material which are filled in a plurality of connecting windows each including at least one connecting hole formed through said interlayer dielectric film;

wherein:
said plugging member provides interconnection between interconnection lines which belong in different interconnection layers or interconnection between an interconnection line which belongs in an interconnection layer and a component; and the overlap margin between each said interconnection line and each said connecting window is set such that each of zones, which result from division according to a specific parameter including at least one of an electric current density, an electric current direction, an electric current waveform, an interconnection line material, a plugging member material, an interconnection line length, an interconnection line width. an interconnection line area, an interconnection line thickness, and an interconnection line capacity at an interconnection line-plugging member interface, has a common interconnection line-connecting window overlap margin.

Within the range that does not affect the electromigration resistance, a layout is designed in order that the connecting window overlap margin may belong in a small zone, and the interconnection line area can be reduced. Additionally, as described above, design, capable of realizing such a structure, is easy to perform. The cost of fabricating semiconductor integrated circuits is held within a practically permissive range.

With respect to the semiconductor integrated circuit of the present invention, corresponding manners to cases in which the specific parameter includes, for example, the electric current density, may be employed.

The present invention provides a computer-readable recording medium for storing a design procedure for a semiconductor integrated circuit having components formed in a semiconductor substrate, a plurality of interlayer dielectric films and a plurality of interconnection layers alternately formed over said semiconductor substrate, and plugging members of a conductive material which are filled In a plurality of connecting windows each including at least one connecting hole formed through said interlayer dielectric film wherein said plugging member provides interconnection between interconnection lines which belong in different interconnection layers or interconnection between an interconnection line which belongs in an interconnection layer and a component, said recording medium storing a program for the execution of a first procedure and a second procedure, wherein:

(a) said first procedure includes:
selecting, as a parameter which affects electromigration resistance at the interface between an interconnection line and a plugging member, a specific parameter including at least one of an electric current direction, an electric current waveform, an interconnection line material, a plugging member material, an interconnection line length, an interconnection line width, an interconnection line area, an interconnection line capacity, an interconnection line thickness, and an overlap margin, exclusive of an electric current amount;

dividing, according to a working condition relative to said specific parameter, the permissive current amount of said connecting window into a plurality of zones; and performing the setting of a representative value common in each of said zones; and (b) said second procedure includes:
determining the representative value of one of said zones to the value of said specific parameter as the permissible current amount of said plugging member.

It is preferred that the computer-readable recording medium further stores a program for the execution of a procedure of subjecting said semiconductor integrated circuit to placement/interconnection before said second procedure and determining, based on the result of said placement/interconnection, the total opening area of each of connecting windows including at least one connecting hole and the form of each said interconnection line, and for the execution of a procedure of determining the total opening area of each said connecting window according to said determined permissible current amount and correcting the form of each said interconnection line according to said total connecting window opening area.

It is preferred that the computer-readable recording medium further stores a program for the execution of a procedure of checking whether the total opening area of each said connecting window determined by said placement/interconnection agrees with said working condition after said second procedure.

The present invention provides a computer-readable recording medium for storing a design procedure for a semiconductor integrated circuit having components formed in a semiconductor substrate, a plurality of interlayer dielectric films and a plurality of interconnection layers alternately formed over said semiconductor substrate, and plugging members of a conductive material which are filled in a plurality of connecting windows each including at least one connecting hole formed through said interlayer dielectric film wherein said plugging member provides interconnection between interconnection lines which belong in different interconnection layers or interconnection between an interconnection line which belongs in an interconnection layer and a component, said computer-readable recording medium storing a program for the execution of a first procedure and a second procedure, wherein:

(a) said first procedure includes:
selecting, as a parameter which affects electromigration resistance at the interface between an interconnection line and a plugging member, a specific parameter including at least one of an electric current amount, an electric current direction, an electric current waveform, an interconnection line material, a plugging member material, an interconnection line length, an interconnection line width, an interconnection line area, an interconnection line thickness, and an interconnection line capacity, exclusive of an overlap margin;

dividing, according to a working condition relative to said specific parameter, the permissible overlap margin between an interconnection line and a connecting window into a plurality of zones; and performing the setting of a representative value common in each of said zones; and (b) said second procedure includes:
determining the representative value of one of said zones determined according to the value of said specific parameter as the overlap margin between said interconnection line and said connecting window.

It is preferred that determination of an overlap margin in said second procedure is carried out, after said semiconductor integrated circuit is subjected to placement/interconnection, according to the result of said placement/interconnection and that said computer-readable recording medium further stores a program for the execution of a procedure of correcting the form of each said interconnection line according to said determined overlap margin.

It is preferred that the computer-readable recording medium further stores a program for the execution of a procedure of checking whether the overlap margin between an interconnection line and a connecting window agrees with said working condition after said overlap margin determination.

The present invention provides the foregoing recording mediums suitably used in performing process steps of the fabrication of miniaturized semiconductor devices with the aid of computer.

BRIEF DESCRIPTION OF THE DRAWINGS

In the accompanying drawings,

FIG. 1, comprised of FIGS. 1(a) and 1(b), shows an inverter circuit laid out in accordance with a first embodiment of the present invention wherein

DETAILED DESCRIPTION OF THE INVENTION

First Embodiment

Figure 1A:
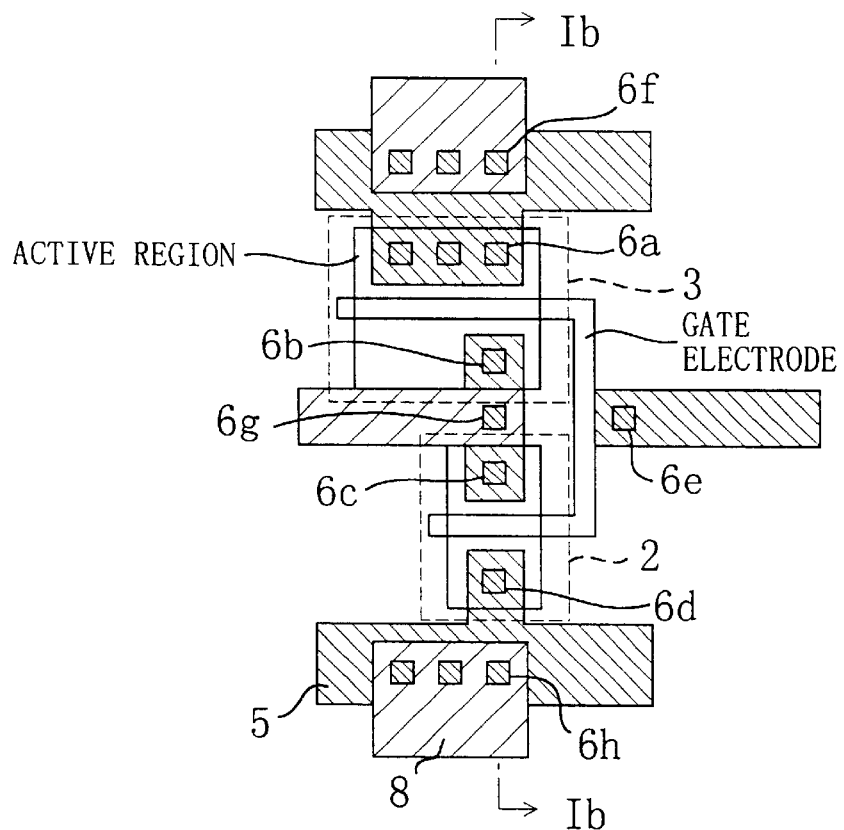
FIG. 1(a) is a top view of the inverter circuit and FIG. 1(b) is a cross-sectional view of the inverter circuit.

A first embodiment of the present invention, in which predetermined permissible current values of Table 2 are applied, is now described below.

Table 2 is a list of the permissible electric currents corresponding to various combinations of the electric current direction, the interconnection line length, and the electric current waveform, showing numeric values as a result of standardization in which the permissible current value of Pattern no. 1 (current: constant DC; current direction: from interconnection line to hole; interconnection line length: above 5 micrometers) that is the severest stress condition in Table 2 serves as standard value, i.e., 1. For the sake of convenience, the standardized permissible current amount is called the "permissible current ratio". Each plug is divided into zones for describing a layout diagram.

TABLE 2

| PATTERN NUMBER | 1 | 2 | 3 | 4 | 5 | 6 | 7 | 8 | 9 | 10 |
|---|---|---|---|---|---|---|---|---|---|---|
| CURRENT | DC | | | | DC PULSE | | | | AC OR BIDIRECTIONAL FLOW | |
| CURRENT DIRECTION | LINE→PLUG | PLUG→LINE | LINE→PLUG | PLUG→LINE | LINE→PLUG | PLUG→LINE | LINE→PLUG | PLUG→LINE | | |
| LINE LENGTH ($\mu$m) | >5 | <5 | >5 | <5 | >5 | <5 | >5 | <5 | >5 | <5 |
| REAL PERMISSIVE CURRENT RATIO | 1 | 5 | 3 | >10 | 3 | >10 | >10 | >10 | >10 | >10 |
| SET PERMISSIVE CURRENT RATIO | 1 | 3 | 3 | 10 | 3 | 10 | 10 | 10 | 10 | 10 |

For the case of general direct current (DC), when the current flow direction is from an interconnection line formed of, for, example, aluminum to a plug formed of, for example, tungsten, the movement of electrons is from the plug to the interconnection line. As a result, the aluminum (or copper) existing near the interface moves into the metallic interconnection line, together with the electrons. On the other hand, when the current flow direction is from a plug to an interconnection line, the movement of electrons is from the interconnection line to the plug. As a result, there occurs little movement of the near-interface aluminum. Accordingly, when an electric current flows from interconnection line to plug, the amount of permissible current allowing for the EM must be made small, while on the other hand when an electric current flows from plug to interconnection line, the amount of permissible current allowing for the EM may be made great. However, for the case of direct pulse current, currents having the same value do not flow in succession and the amount of permissible current in consideration of EM is diminished. For the case of alternating current (AC) or for the case of bidirectional direct current, electrons move in either direction and the phenomenon of EM is unlikely to occur. Permissible current amount is further diminished. From the viewpoint of the above, the actual permissible current ratio of Table 2 is divided into zones according to the parameter combination.

As can be seen from Table 2, in comparison with the pattern no. 1. more than ten times greater electric current can be of permission in the pattern nos. 9 and 10 in which the current waveform is either AC or bidirectional DC that flows in either direction. Also, when the interconnection line length is 5 micrometers or less, in comparison with the pattern no. 1, more than 10 times greater current can be permitted unless a continuous DC flows.

The dimensions of a connecting window which includes at least one contact hole or one via hole to be filled with a plug are likely to be determined uniformly according to design rules. It is therefore preferred that a permissible current is represented by an index corresponding to the number of plug holes required depending on an actual permissible current. Correspondingly to the number of plugs required, a design permissible current is divided into three zones of 1, 3, and 10, and a layout is designed in order that the numbers of plugs may be 3, 2, and 1 according to the values of design permissible current ratios, i.e., 1, 3, and 10.

It is to be noted that the permissible current ratios shown in Table 2 are experimentally determined according to, for example, the method of fabrication and the characteristic of production line.

Figure 1B:
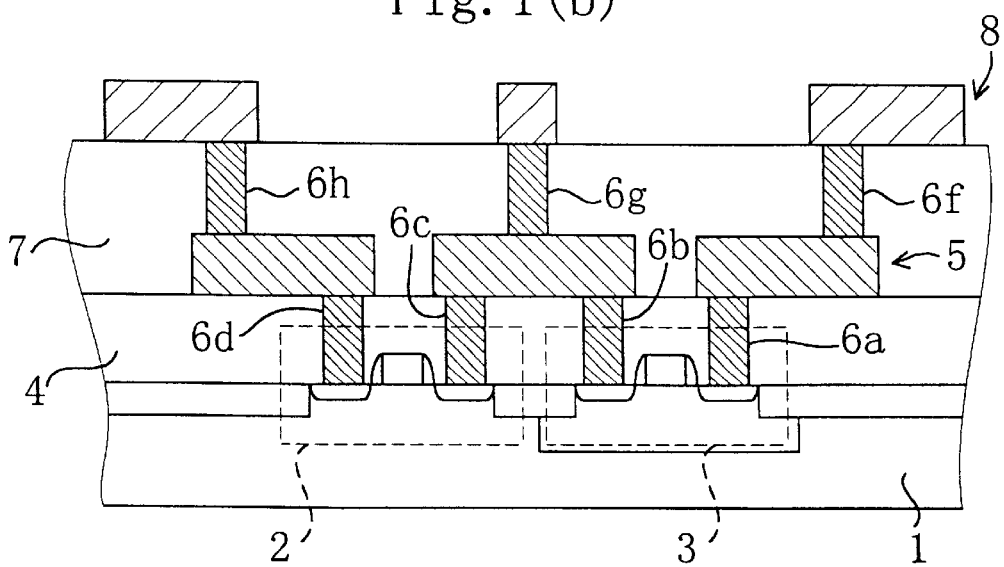

FIG. 1, comprised of FIG. 1(a) and FIG. 1(b), depicts a conventional CMOS inverter circuit laid out in accordance with the permissive current amount of Table 2. FIG. 1(a) is the top view and FIG. 1(b) is the cross-section view taken along lines Ib—Ib of FIG. 1(a).

Formed in a semiconductor substrate 1 are an nMOS transistor 2 and a pMOS transistor 3. A first interlayer dielectric film 4 is deposited overlying the semiconductor substrate 1 and the transistors 2 and 3. A first metallic interconnection layer 5 of an aluminum alloy is formed overlaying the first interlayer dielectric film 4. Formed through the first interlayer dielectric film 4 are connecting windows each of which includes at least one connecting hole which extend to impurity-diffused regions (source/drain regions) of the transistors 2 and 3. The first metallic interconnection layer 5 is connected, via a first to fourth plugs 6a–6d of tungsten used to fill a first to fourth connecting windows each of which includes at least one connecting hole, to the impurity-diffused regions of the transistors 2 and 3. In a cross-section, not appeared in FIG. 1(b), a connecting hole is formed in the first interlayer dielectric film 4, extending to a portion common between the gate electrodes of the transistors 2 and 3, and interconnection between the first metallic interconnection layer 5 and the gate electrodes of the transistors 2 and 3 is established by a fifth plug 6e of tungsten used to fill the connecting hole. Additionally, deposited over the first metallic interconnection layer 5 is a second interlayer dielectric film 7. A second metallic interconnection layer 8 of an aluminum alloy is formed overlying the second interlayer dielectric film 7. Via holes are formed in the second interlayer dielectric film 7, extending to the first metallic interconnection layer 5, and the second metallic interconnection line layer 8 is connected, via a sixth to eighth plugs 6f–6h of tungsten used to fill a sixth to eighth connecting windows each of which includes at least one via hole, to the first metallic interconnection layer 5.

The reason of why the pMOS transistor 3 has a gate width twice that of the nMOS transistor 2 is that the electric current drive performance of the PMOS transistor 3 per unit gate width is about ½ of that of the nMOS transistor 2. In order to simplify the description, it is supposed such that the amount of direct pulse current and the amount of alternating current flowing in each of the plugs 6a–6g are the same. However, there is no need for taking EM into account with respect to the interconnection between plug and semiconductor substrate and between plug and polysilicon film. It is therefore sufficient to take into account only interconnection with the first metallic interconnection layer 5 for the first to fifth plugs 6a–6e. It is necessary to take into account interconnection with the first and second metallic interconnection layers 5 and 8 for the sixth to eighth plugs 6f–6h.

First Plug 6a

The interface between the first plug 6a and the first metallic interconnection layer 5 is equivalent to Pattern no. 5 (current: DC pulse; current direction: from line to plug; line length: above 5 micrometers).

Second Plug 6b

The interface between the second plug 6b and the first metallic interconnection layer 5 is equivalent to Pattern no. 8 (current: DC pulse; current direction: fromplug to line; line length: below 5 micrometers).

Third Plug 6c

The interface between the third plug 6c and the first metallic interconnection layer 5 is equivalent to Pattern no. 6 (current: DC pulse; current direction: from line to plug; line length: below 5 micrometers).

Fourth Plug 6d

The interface between the fourth plug 6d and the first metallic interconnection layer 5 is equivalent to Pattern no. 7 (current: DC pulse; current direction: fromplug to line; line length: above 5 micrometers).

Fifth Plug 6e

The interface between the fifth plug 6e and the first metallic interconnection layer 5 is equivalent to Pattern no. 9 (current: AC; current direction: bidirectional flow; line length: above 5 micrometers).

Sixth Plug 6f

The interface between the sixth plug 6f and the first metallic interconnection layer 5 is equivalent to Pattern no. 7 (current: DC pulse; current direction: from p lug to line; line length: above 5 micrometers). On the other hand , the interface between the sixth plug 6f and the second metallic interconnection layer 8 is equivalent to Pattern no. 5 (current: DC pulse; current direction: from line to plug; line length: above 5 micrometers).

Seventh Plug 6g

The interface between the seventh plug 6g and the first metallic interconnection layer 5 is equivalent to Pattern no. 10 (current: AC; current direction: bidirectional flow; line length: below 5 micrometers). On the other hand, the interface between the seventh plug 6g and the second metallic interconnection layer 8 is equivalent to Pattern no. 9 (current: AC; current direction: bidirectional flow; line length: above 5 micrometers).

Eighth Plug 6h

The interface between the eighth plug 6h and the first metallic interconnection layer 5 is equivalent to Pattern no. 5 (current: DC pulse; current direction: from line to plug; line length: above 5 micrometers). On the other hand, the interface between the eighth plug 6h and the second metallic interconnection layer 8 is equivalent to Pattern no. 7 (current: DC pulse; current direction: from plug to line; line length: above 5 micrometers).

The plug which fills a via hole has two different patterns, namely the one at the top and the other at the bottom, and the lower one of the permissible current values of the patterns must be applied for the via hole. For example, with the sixth plug 6f the interface with the metallic inter connection layer 5 exhibits Pattern no. 7 (the permissible current ratio=10) while the interface with the metallic interconnection layer 8 exhibits Pattern no. 5 (the permissible current ratio=3). Therefore, the lower on e of these two permissible current ratios, i.e., 3, must be applied f or the plug.

The first, sixth and eighth plugs 6a, 6f, and 6h each have a permissible current ratio of 3 while the remaining other plugs have a permissible current ration of 10. Accordingly, as shown in FIG. 1(a), the plugs other than the plugs 6a, 6f, and 6h requires a less number of holes for connection.

Figure 3:
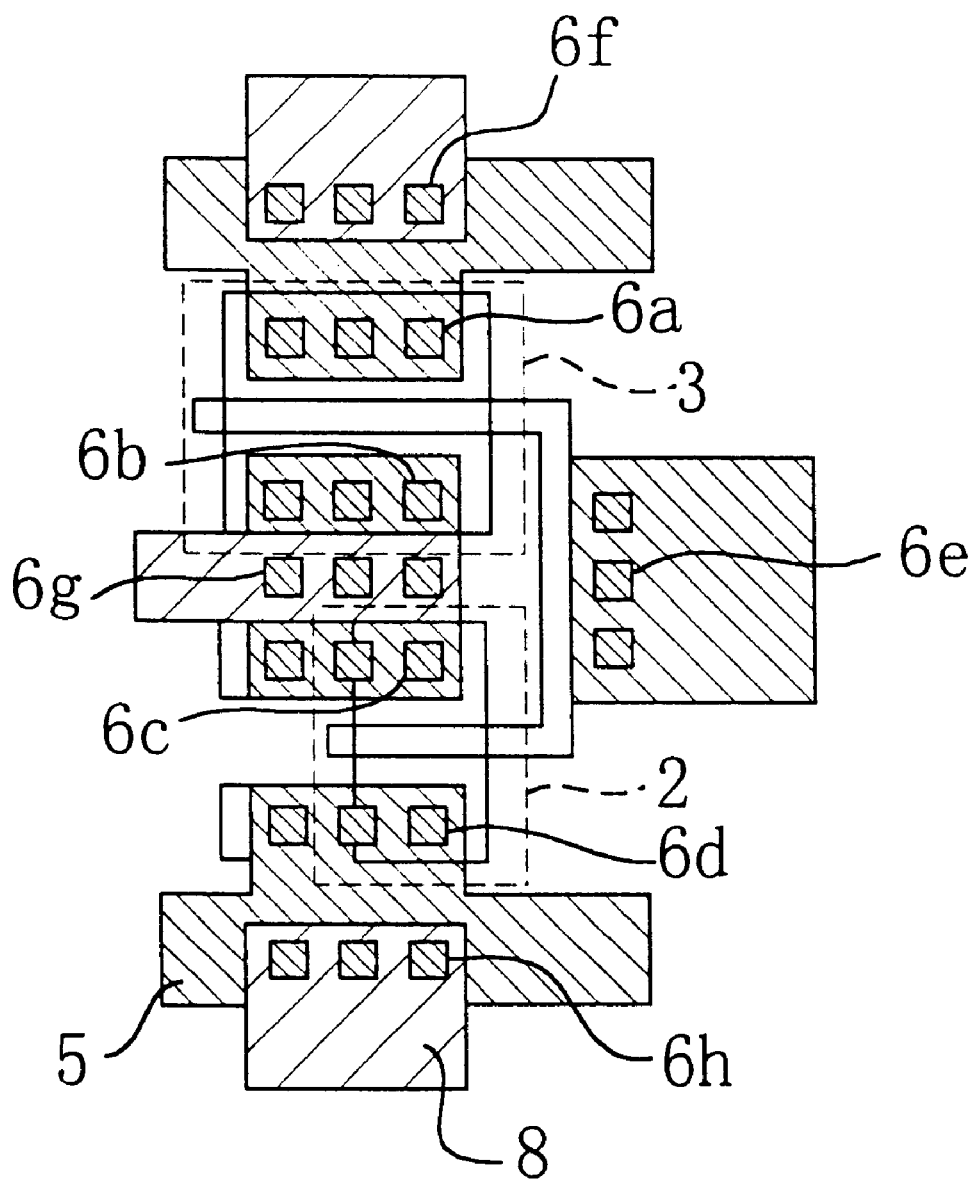
FIG. 3 is a top view of an inverter circuit laid out in accordance with commonly-used technique.

In the conventional design, the permissible current ratio of 3 corresponding to DC pulse current is applied to all holes In the foregoing logical circuit, and therefore circuits like the present embodiment must be laid out as shown in FIG. 3. Conversely, In accordance with the present embodiment, plugs in connecting holes or in via holes under various stress conditions, such as current direction and interconnection line length, are divided Into zones by the permissible current amount, and a common permissible current amount Is set within a zone. Such arrangement makes it possible to achieve, in an easy way, a layout design which incorporates therein a permissible current amount allowing for various types of dependence, without having to prepare complicated tables or to perform huge amounts of arithmetic processing.

The opening area of connecting holes may be determined using either the steps ST1–ST3 shown in FIG. 5 or the steps ST11–ST16 shown in FIG. 7 which will be described later. It is however to be noted that other procedures may be employed for the determination of a connecting hole opening area.

ging member cross-sectional area, i.e., the total opening area (the number of connecting holes). For example, all the design permissible current ratios of Table 2 may be set to have a value of 10.

Second Embodiment

A second embodiment of the present invention is now described. In the present embodiment, the overlap margin is set as shown in Table 3.

TABLE 3

| PATTERN NUMBER | 1 | 2 | 3 | 4 | 5 | 6 | 7 | 8 | 9 | 10 |
|---|---|---|---|---|---|---|---|---|---|---|
| CURRENT | DC | | | | $DC/^* /\!\!\!/\!\lambda$ | | | | AC OR | |
| CURRENT DIRECTION | LINE→PLUG | PLUG→LINE | LINE→PLUG | PLUG→LINE | LINE→PLUG | PLUG→LINE | LINE→PLUG | PLUG→LINE | BIDIRECTIONAL FLOW | |
| LINE LENGTH ($\mu$m) | >5 | <5 | >5 | <5 | >5 | <5 | >5 | <5 | >5 | <5 |
| CURRENT AMOUNT | HIGH | LOW | HIGH | LOW | HIGH | LOW | HIGH | LOW | HIGH | LOW |
| OVERLAP MARGIN ($\mu$m) | 0.5 | 0.25 | 0.5 | 0.25 | 0.25 | 0 | 0.25 | 0 | 0 | 0 |

In Table 2, the number of zones is three (three types of predetermined permissible current ratios). The number may be less than three or may exceed three. Additionally, two values are set for each parameter in Table 2. Three or more values may be set for each parameter.

In accordance with the present embodiment, the dimensions of connecting holes are uniformly the same and the total of the opening areas of connecting holes are divided into zones according to the number of connecting holes. The present Invention Is not limited to the present embodiment. The opening area of one connecting hole may be arranged to change. For example, of the dimensions of a connecting hole the length of one of the sides is fixed while the length of the other of the sides is changed. However, taking into account, f or example, the locality of current flowing in plugs, in practical applications the dimensions of connecting holes are made uniform and the number of connecting holes is changed according to the current value.

In Table 2 all the design permissible current ratios in a range in which the actual permissible current ratio is 10 or more are dealt with equally. The reason is that it is impossible to reduce the number of connecting holes to below one when the actual permissible current ratio is 10 or more. Accordingly, when it is arranged such that the opening area of one connecting hole changes, the permissible current ratio may be further divided into a greater number of zones within a range where the actual permissible current ratio is 10 or more.

In the present embodiment, the width of interconnection line is not adopted as a parameter that affects EM; however, interconnection line width may serve as an EM parameter. Particularly, in cases where the interconnection line width is narrow, the so-called "bamboo structure", in which aluminum crystals individually line up in the longitudinal direction, that is, no grain boundaries are formed In the interconnection line's longitudinal direction, may be used as, for example, an aluminum interconnection structure. It has been known that EM hardly occurs when there exist no grain boundaries along which the aluminum atoms are likely to move. Accordingly, it becomes possible to perform design capable of providing a considerable reduction of the plug- As shown in Table 3, a procedure of dividing an overlap margin into zones is almost the same as the one of the first embodiment shown In Table 2. In the present embodiment, however, the size of overlap margin is not distinguished with respect to the current direction, for the purpose of simplifying the procedure. It is possible to divide an overlap margin into a much greater number of zones with respect to the current direction in order of improving the effect of providing a reduction of the area occupied by interconnection. Additionally, as in the first embodiment, overlap margin division according to the interconnection line width may improve the effect of providing a reduction of the area occupied by interconnection.

The overlap margin values, shown in Table 3, are experientially determined according to the method of fabrication and to the characteristic of production line, like the permissible current ratio values of Table 2.

Figure 2A:
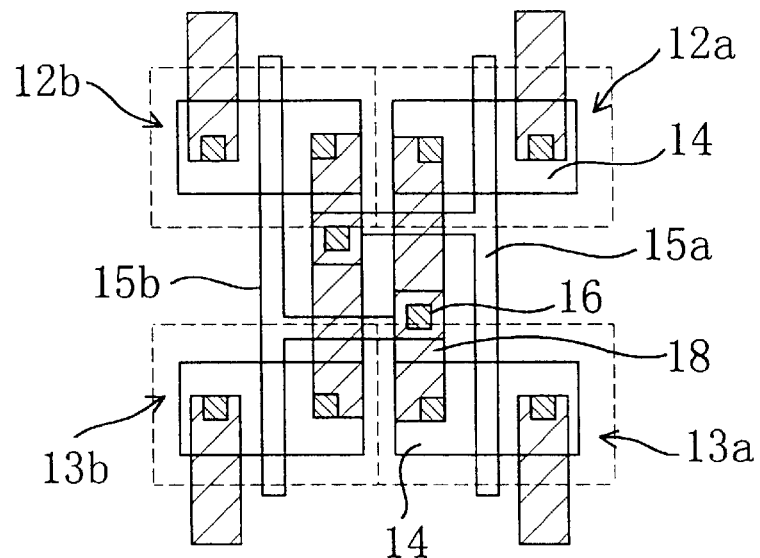
FIGS. 2(a) and 2(b) are top views of a flip-flop circuit and an inverter circuit at the last stage in a memory cell block of an SRAM laid out in accordance with a second embodiment of the present invention.

FIG. 2(a) is a top view of a CMOS flip-flop circuit which is formed of a combination of four transistors for use in, for example, SRAM memory cells and which is laid out based on the overlap margin setting shown in Table 3. Formed respectively in four active regions 14 surrounded by element isolators are nMOS transistors 12a and 12b and pMOS transistors 13a and 13b. A gate electrode 15a common between the nMOS transistor 12a and the pMOS transistor 13a, a gate electrode 15b common between the nMOS transistor 12b and the pMOS transistor 13b, and a plug 16, which provides interconnection between an overlying aluminum interconnection line 18 and the portions of the transistors, are formed.

Figure 2B:
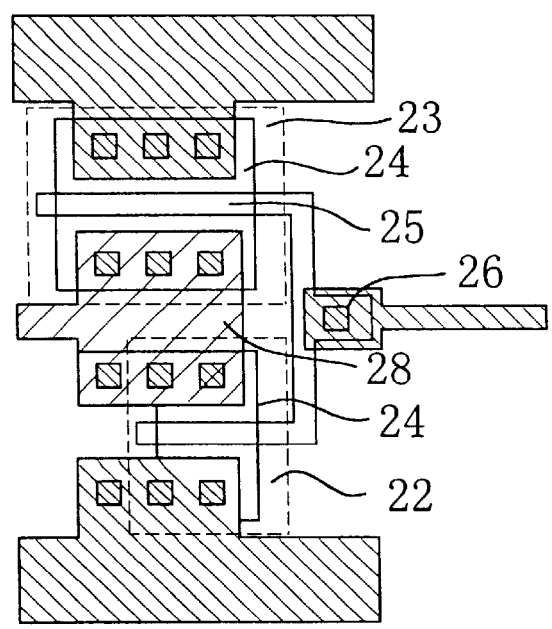

FIG. 2(b) is a top view of a layout of an inverter circuit which is disposed at the last stage of, for example, an SRAM memory cell block and sends signals to other blocks. Formed respectively in two active regions 24 surrounded by element isolators are an nMOS transistor 22 and a pMOS transistor 23. A gate electrode 25 common among the transistors and a plug 26 for establishing interconnection between an overlying aluminum interconnection line 28 and the portions of the transistors are formed.

For the case of the SRAM memory cell of FIG. 2(a), it is arranged for the four transistors to neighbor for achieving higher density as well as for achieving pattern symmetry. Therefore, at present the length of interconnection lines for providing interconnection between transistor regions does not exceed 5 micrometers. The type of electric current flowing through interconnection lines is a pulse current the current value of which is low.

On the other hand, the inverter circuit of FIG. 2(b) is used to send to another block signals over the interconnection line having a length of a few millimeters or more. Accordingly, although a pulse current flows through the inverter circuit, it is needed to deal with a considerably large current because the load is great.

To sum up, the phenomenon of electromigration hardly occurs in short, low current-value interconnection lines like ones in the inside of the SRAM memory cell circuit of FIG. 2(a), while on the other hand such phenomenon is likely to occur in the long, large current-value interconnection line of FIG. 2(b). If the working conditions of these lines are applied to Table 3, this makes it possible to set a small overlap margin for the interconnection lines of FIG. 2(a). On the other hand, it is required to set a large overlap margin for the interconnection lines of FIG. 2(b).

The overlap margin may be determined performing either the steps ST1–ST3 of FIG. 5 or the steps ST11–ST16 of FIG. 7 which are described later. However, the procedure for determination of an overlap margin is not limited to these steps.

Figure 4:
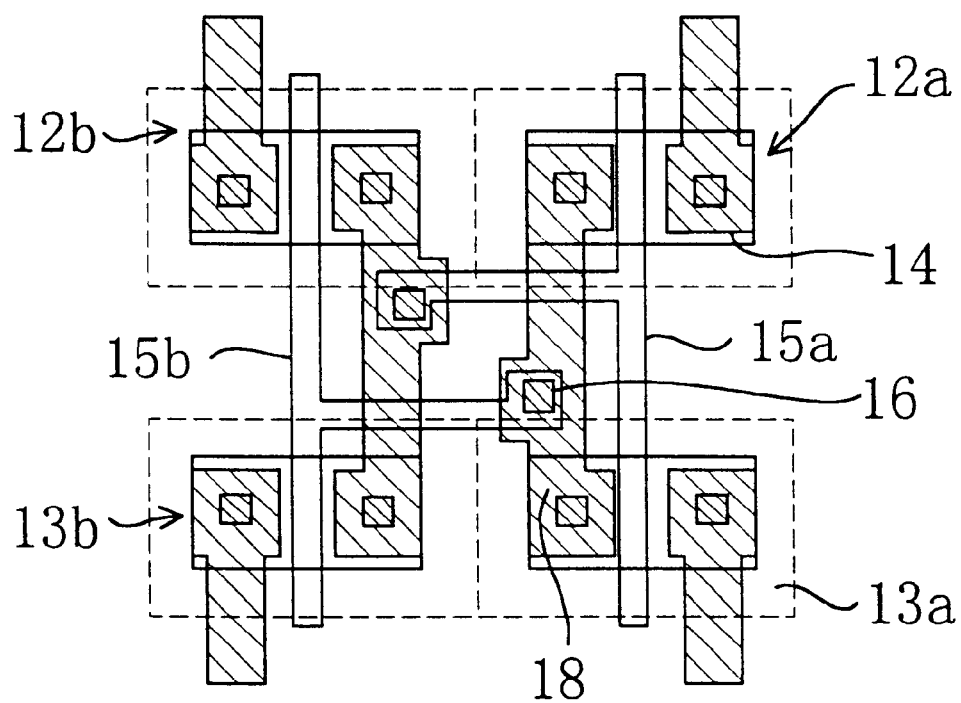
FIG. 4 is a top view of a flip-flop circuit in a memory cell block of an SRAM laid out in accordance with a commonly-used technique.

FIG. 4 is a plane view of a layout of a flip-flop circuit forming, for example, a conventional SRAM memory cell. In the flip-flop circuit of FIG. 4, a large overlap margin is set as in the interconnection lines in the inverter circuit at the last block stage (see FIG. 2(b)). This results in an increase in the area occupied by interconnection, leading to an increase in the area occupied by flip-flop circuit. Conversely, in accordance with the present embodiment, the overlap margin is set small as shown in FIG. 2(a), which makes it possible to achieve a reduction of the area occupied by interconnection as well as to provide higher-density semiconductor integrated circuits to the miniaturization of semiconductor elements.

Also, in conventional SRAM structures, the plane structure of a laid-out inverter circuit disposed at the last stage of a memory cell block is basically the same as the one shown in FIG. 2(b), with the exception that the former is greater in overlap margin than the latter. The present embodiment provides, particularly within SRAM memory cells, a remarkable reduction of the area occupied by interconnection.

Third Embodiment

A third embodiment of the present invention is now described. FIG. 5 is a block diagram illustrating a design system for a semiconductor integrated circuit of the present embodiment and an associated procedure thereof. A semiconductor integrated circuit design system in accordance with the present embodiment is applicable in the design methods described in the first and second embodiments of this invention.

Figure 5:
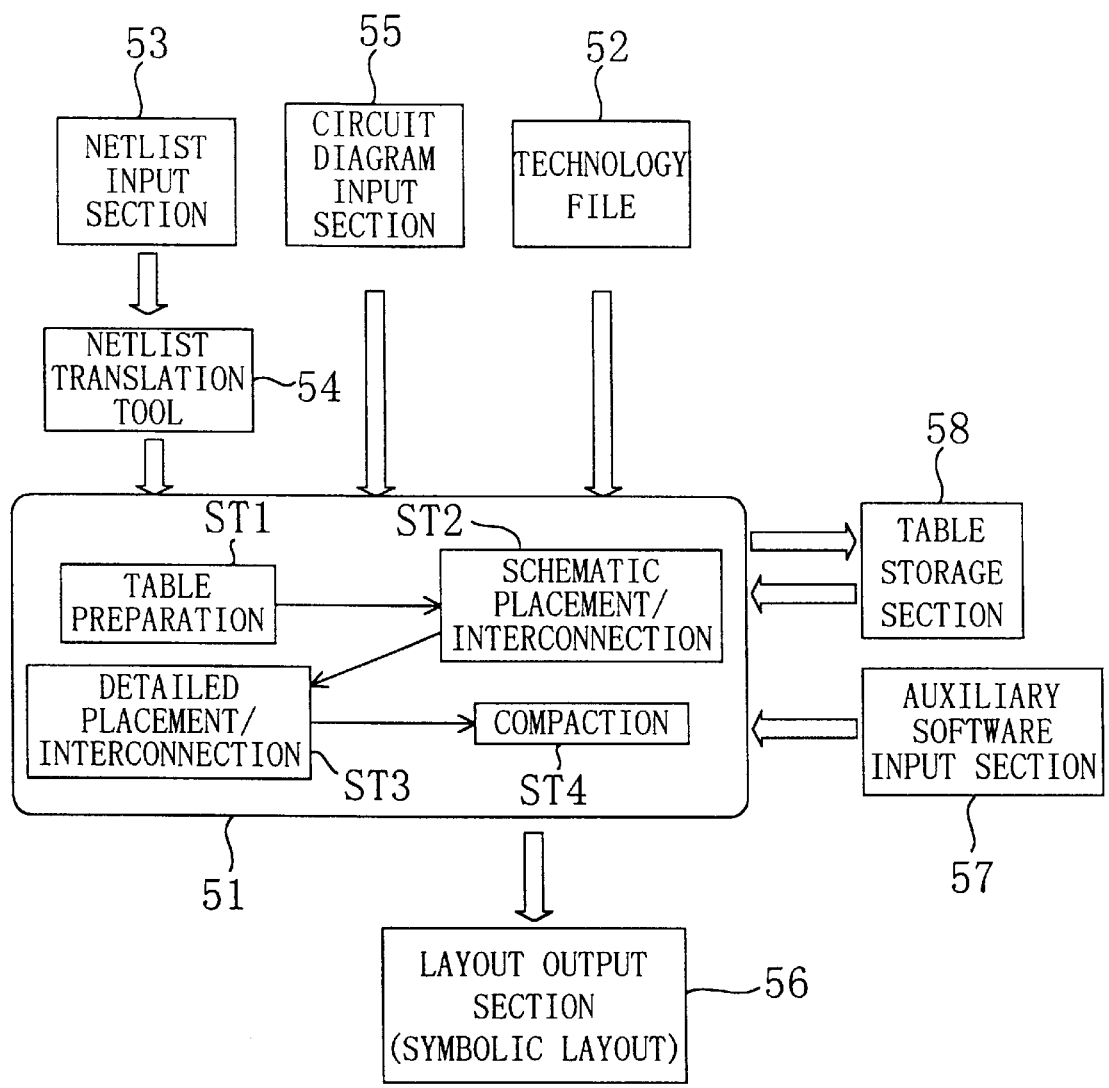
FIG. 5 is a block diagram outlining the organization of a semiconductor integrated circuit design system in accordance with a third embodiment of the present invention.

Referring to FIGS. 5, 51 is a program execution section used to execute a program in respect to the design procedure, 52 is a technology file used to store various types of technology information, 53 is a netlist input section used to input a netlist describing, for example, the interconnection relationship between components, 54 is a netlist translation tool, 55 is a circuit diagram input section used to input a circuit diagram for a semiconductor integrated circuit which has been logically designed, 56 is a layout output section used to output a symbolic layout representing a final circuit in the forms of symbolized elements and interconnection lines, 57 is an auxiliary software input section used to input software for the saving of number of pins, placement, and timing, and 58 is a table storage section used to store a table with the contents of Tables 2 and 3. The program execution section 51 and the table storage section 58 are recorded on recording medium such as a magnetic tape and a CD-ROM according to the present embodiment.

Layout design is carried out in the program execution section 51 according to the following procedure.

At step ST1, a table similar to Table 2 or 3 is created based on the netlist information. Only basic parameters of Table 2 or 3 are recorded in advance on recording medium, which allows for the user to set specific numeric values, determined by, for example, the process type of fabrication and the characteristic of production line. Next, at step ST2, a schematic placement/interconnection process is carried out. At step ST3, a detailed placement/interconnection process is carried out. That is, referring to the table as to the permissible current and the permissible overlap margin from schematic placement/interconnection stored in the table storage section 58, a total connecting hole opening area and an overlap margin are determined and, based on the result, placement/interconnection correction is made. As a result, for example, the layouts, shown in FIGS. 1 and 2, are created. The layout output section 56 provides a symbolic diagram in which components and interconnection lines are represented in symbolized form.

In the present embodiment, the magnetic disk is used as recording medium. This invention is not limited to such recording medium. For instance, the recording medium may be a magnetic means such as bubble memory. Additionally, the recording medium may be an optical disk by patterns of mechanical recess and projecting portions. Further, the recording medium may be a semiconductor memory which makes use of the presence or absence of electric charge and the difference in electric connection state. Additionally, the medium may be a recording medium by optical pattern such as bar code. In other words, any computer-readable recording medium may be adopted.

In the present embodiment, the table storage section 58 is incorporated in the recording medium. However, the present invention is not limited to such arrangement. It may be arranged such that tables are stored in a different storage device of the tool and the recording medium stores only a program for executing a procedure of storing a table.

Fourth Embodiment

A fourth embodiment is now described. The present embodiment relates to a recording medium which internally stores a program used to execute only a procedure in order that creating tables and checking whether design rules are met may be automatically carried out.

Figure 6:
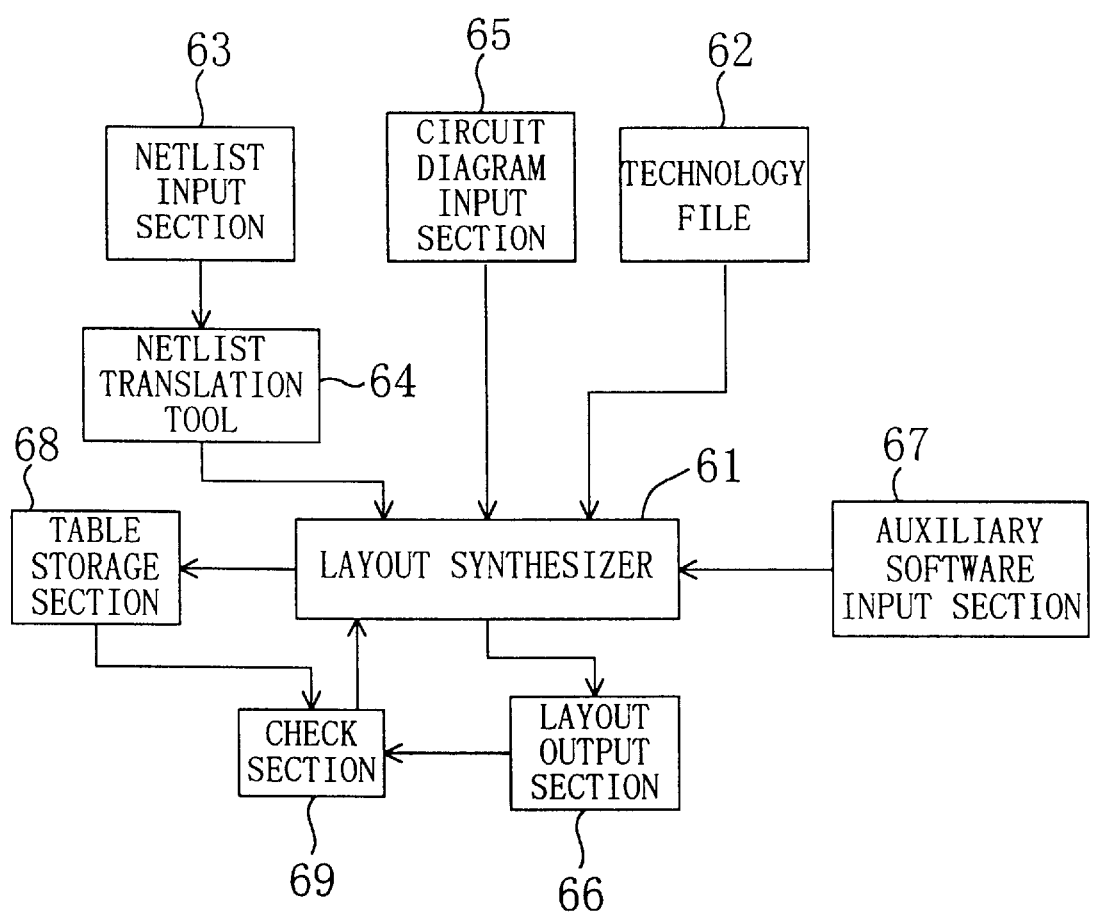
FIG. 6 is a block diagram outlining the organization of a semiconductor integrated circuit design system in accordance with a fourth embodiment of the present invention.

FIG. 6 is a block diagram schematically showing the organization of a semiconductor integrated design system according to the present embodiment together with a design flow. The design system of the present embodiment is applicable in both the design methods of the first and second embodiments.

Referring to FIGS. 6, 61 is a layout synthesizer for performing placement/interconnection, 62 is a technology file used to store various types of technology information, 63 is a netlist input section used to input a netlist describing, for example, the interconnection relationship between components, 64 is a netlist translation tool, 65 is a circuit diagram input section used to input a circuit diagram for a semiconductor integrated circuit which has been logically designed, 66 is a layout output section used to output a symbolic layout representing a final circuit in the forms of symbolized elements and interconnection lines, 67 is an auxiliary software input section used to input software for the saving of number of pins, placement, and timing, 68 is a table storage section used to store a table with the contents of Tables 2 and 3, and 69 is a check section used to determine whether a placement/interconnection result meets the design rule. The check section 69 and the table section 68 are recorded on recording medium such as magnetic tape and CD-ROM in accordance with the present embodiment.

Figure 7:
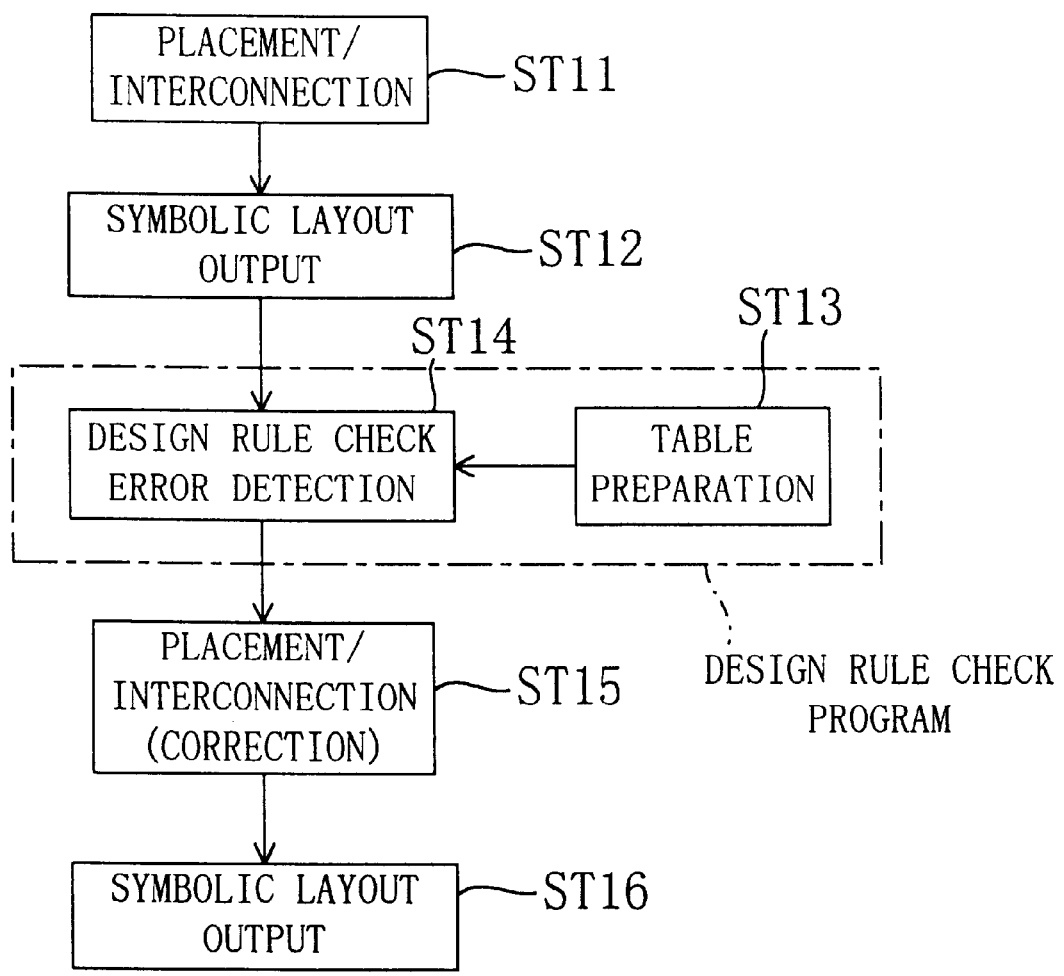
FIG. 7 is a flow diagram showing steps of the design of a semiconductor integrated circuit in accordance with the fourth embodiment.

FIG. 7 is a flow diagram showing a design procedure in the present embodiment. Suppose here a situation that netlists, circuit diagrams for design, and technology information are already input. At step ST11, placement/interconnection is carried out in the layout synthesizer 61. Next, at step ST12, the layout output section 56 outputs a symbolic layout representing the result of the placement/interconnection in a symbolic diagram form. Subsequently, at step ST13, a table similar to Table 2 or 3 is created based on information from a netlist. Only basic parameters of Table 2 or 3 are recorded in advance on recording medium, which allows for the user to set specific numeric values, determined by, for example, the process type of fabrication and the characteristic of production line. At step ST14, the symbolic layout provided at step ST12 and the table created at step ST13 are referred to. That is to say, checking is made to determine if the opening area and the overlap margin of each connecting hole meet a permissible current and a permissible overlap margin stored in the table storage section 68, to detect an error if any. At step ST15, placement/interconnection correction is made. Thereafter, at step ST16, a symbolic layout is output again from the layout output section 66.

Either the steps ST11 and ST12 or the steps ST15 and ST16 may be manually carried out. Alternatively, these steps may be automatically performed using a program stored in a different recording medium from the recording medium of the present invention.

In accordance with the design method of this embodiment, for the case of performing the steps ST11-ST16 of FIG. 7, a placement/interconnection process is carried out at a pre-decreased degree of allowance. Thereafter, a comparison is made between an overlap margin determined by the result of the placement/interconnection process and Table 3, in order to detect whether the working condition corresponding to the overlap margin of each portion agrees with the permissible overlap margin. This enables detection of an error.

In accordance with the present embodiment, the program for performing the steps ST13 and ST14 in the FIG. 7 flow diagram is recorded on recording medium such as magnetic tape and CD-ROM. This produces advantage and disadvantage. The drawback is that the amount of portion that can be automated decreases. On the other hand, the advantage is that the miniaturization of interconnection structure can be realized using a currently-used general-purpose placement/interconnection tool.

In accordance with the present embodiment, the table storage section 68 is incorporated in the recording medium. However, the present invention is not limited to such arrangement. It may be arranged such that the table is stored in a different storage device disposed in the tool and the recording medium stores only a program for executing a procedure of storing the table.

Other Embodiments

In each of the first and second embodiments of the present invention, interconnection lines are formed of aluminum alloy. However, the present invention is not limited to such an interconnection line material. The present invention is applicable to interconnection lines formed of copper. Additionally, the present invention may be applied to aluminum interconnection with an additional Ti underlying film or with an additional Ti/TiN underlying film.

Tungsten is used as plugging member material. In addition to tungsten, Mo, Mo alloy, Ti and Ti alloy may be used. A structure, in which a Ti/TiN underlying film is formed in a W-plug, may be adopted. Additionally, plugging members and interconnection lines may be formed using the same material. For example, the present invention is applicable to technology in which through holes are formed in an interlayer dielectric film and a film of aluminum alloy is formed in the through holes as well as on the interlayer dielectric film. Further, the present invention is applicable to technology in which grooves and through holes are formed and it is arranged such that a copper alloy reflows in the grooves and the through holes to form interconnection of the groove filling type, for electromigration between a portion filled in a through hole and interconnection directly below the portion may be a problem.

In general, the interconnection line thickness is fixed in the process of fabrication. For this reason, the interconnection line thickness is not mentioned specifically in each of the above-described embodiments of the present invention. However, in cases in which the interconnection line thickness differs from interconnection region to interconnection region, the interconnection line thickness may serve as parameter for dividing a plug's cross-sectional area or an overlap margin into zones. Electromigration is more unlikely to occur when the interconnection line capacity is small than when the interconnection line capacity is great. Therefore, it can be of great value to use every factor that affects the interconnection line capacity as the zoning parameter previously described.

Each of the foregoing embodiments of this invention has been described in terms of the semiconductor integrated circuit having a two-level interconnection structure. However, the present invention is not limited to these embodiments. The present invention is, of course, applicable to semiconductor integrated circuits having a multilevel interconnection structure such as three- or more level interconnection structure.

In an SRAM cell, most of its interconnection lines have an interconnection line length of below 5 micrometers. For this reason, in each of the embodiments of the present invention, the permissible current value or the overlap margin is classified by whether the interconnection line length falls below 5 micrometers or exceeds 5 micrometers. When paying attention to a conventional logical circuit designed by synthesis of standard cells constructed of tens of transistors, most of the interconnection lines in a standard cell have an interconnection line length of below 100 micrometers. It is therefore preferred that the permissible current value or the overlap margin is classified by whether the interconnection line length falls below 100 micrometers or exceeds 100 micrometers.

In each of the foregoing embodiments, schematic placement/interconnection is first carried out. This is followed by a process of determining a total connecting hole area and an overlap margin by making reference to tables. Thereafter, detailed placement/interconnection is performed. It is to be noted that the present invention is not limited to the embodiments. For example, placement/interconnection may be carried out while at the same time determining a total opening area and an overlap margin, without carrying out schematic placement/interconnection.

The invention claimed is:

1. A design method for a semiconductor integrated circuit having components formed in a semiconductor substrate, a plurality of interlayer dielectric films and a plurality of interconnection layers alternately formed over said semiconductor substrate, and plugging members of a conductive material which are filled in a plurality of connecting windows each including at least one connecting hole formed through said interlayer dielectric film wherein said plugging member provides interconnection between interconnection lines which belong in different interconnection layers or interconnection between an interconnection line which belongs in an interconnection layer and a component, said semiconductor integrated circuit design method comprising:

(a) a first step including:
  selecting, as a parameter which affects electromigration resistance at the interface between an interconnection line and a plugging member, a specific parameter including at least one of an electric current direction, an electric current waveform, an interconnection line material, a plugging member material, an interconnection line length, an interconnection line width, an interconnection line area, an interconnection line capacity, an interconnection line thickness, and an overlap margin;
  dividing, according to a working condition relative to said specific parameter, the permissive current amount of a plugging member into a plurality of zones; and
  performing the setting of a representative value common in each of said zones; and (b) a second step including:
  determining the representative value of one of said zones to the value of said specific parameter as the permissible current amount of said plugging member; and
  determining the total opening area of each said connecting window or the plane form of each said interconnection line according to said permissible current amount.

2. The semiconductor integrated circuit design method according to claim 1 wherein in said second step said semiconductor integrated circuit is subjected to schematic placement/interconnection before the determination of said permissible current amount, the total opening area of each said connecting window is determined according to a permissible current amount determined based on the result of said placement/interconnection, and the form of each said interconnection line is corrected according to said total opening area of each said connecting window.

3. The semiconductor integrated circuit design method according to claim 1 further comprising, at least before said second step, a step of subjecting said semiconductor integrated circuit to placement/interconnection wherein in said second step when the total opening area of each said connecting window determined according to the result of said placement/interconnection disagrees with said working condition said placement/interconnection performed is corrected.

4. The semiconductor integrated circuit design method according to claim 1 wherein the approximate capacity of each said interconnection line is predetermined and wherein in said first step an approximate interconnection line capacity is included in said specific parameter and the representative value of a zone having an approximate interconnection line capacity below a given capacity is set in such a way as to exceed the representative value of a zone having an approximate interconnection line capacity above said given capacity.

5. The semiconductor integrated circuit design method according to claim 1 wherein the length of each said interconnection line is predetermined and wherein in said first step an interconnection line length is included in said specific parameter and the representative value of a zone having an interconnection line length below a given value is set in such a way as to exceed the representative value of a zone having an interconnection line length above said given value.

6. The semiconductor integrated circuit design method according to claim 1 wherein the approximate width of each said interconnection line is predetermined and wherein in said first step an approximate interconnection line width is included in said specific parameter and the representative value of a zone having an approximate interconnection line width below a given value is set in such a way as to exceed the representative value of a zone having an approximate interconnection line width above said given value.

7. The semiconductor integrated circuit design method according to claim 1 wherein the length and the approximate width of each said interconnection line are predetermined and wherein in said first step both an interconnection line length and an approximate interconnection line width are included in said specific parameter and the representative value of a zone having an interconnection line length and an approximate interconnection line width, at least one of which falling below a corresponding one of given values, is set in such a way as to exceed the representative value of a zone having an interconnection line length and an approximate interconnection line width, both of which exceeding said given values.

8. The semiconductor integrated circuit design method according to claim 1 wherein it is predetermined whether the waveform of an electric current that flows In a plugging member is a unidirectional current or a bidirectional current and wherein in said first step an electric current waveform is included in said specific parameter and the representative value of a zone in which a bidirectional electric current flows is set in such a way as to exceed the representative value of a zone in which a unidirectional electric current flows.

9. The semiconductor integrated circuit design method according to claim 8 wherein it is determined whether a unidirectional current waveform is a pulse current or a continuous current and wherein in said first step a unidirectional current waveform is included in said specific parameter and the permissible current of a zone in which said unidirectional current is a pulse current is set in such a way as to exceed the permissible current of a zone in which said unidirectional current is a continuous current.

10. The semiconductor integrated circuit design method according to claim 1 wherein the direction of an electric current which flows between a plugging member and an interconnection line is predetermined and wherein in said first step an electric current flow direction is included in said specific parameter and the permissible current of a zone in which an electric current flows from a plugging member to an interconnection line is set in such a way as to exceed the permissible current of a zone in which an electric current flows in the opposite direction.

11. The semiconductor integrated circuit design method according to claim 10 wherein it is predetermined that pMISFETs and nMISFETs are mounted, as said components, in said semiconductor substrate and wherein said current flow direction is decided by whether said component is a pMISFET or an nMISFET.

12. The semiconductor integrated circuit design method according to claim 1 wherein the basic dimensions of said connecting holes are unified and wherein in said step of determining the total opening area of each said connecting window the number of connecting holes is determined.

13. A design method for a semiconductor integrated circuit having components formed in a semiconductor substrate, a plurality of interlayer dielectric films and a plurality of interconnection layers alternately formed over said semiconductor substrate, and plugging members of a conductive material which are filled in a plurality of connecting windows each including at least one connecting hole formed through said interlayer dielectric film wherein said plugging member provides interconnection between interconnection lines which belong in different interconnection layers or interconnection between an interconnection line which belongs in an interconnection layer and a component, said semiconductor integrated circuit design method comprising:

(a) a first step including:
selecting, as a parameter which affects electromigration resistance at the interface between an interconnection line and a plugging member, a specific parameter including at least one of an electric current amount, an electric current direction, an electric current wave form, an interconnection line material, a plugging member material, an interconnection line length, an interconnection line width, an interconnection line area, an interconnection line thickness, and an interconnection line capacity;
dividing, according to a working condition relative to said specific parameter, the overlap margin between an interconnection line and a connecting window into a plurality of zones; and
performing the setting of a representative value common in each of said zones; and (b) a second step including:
determining the representative value of one of said zones to the value of said specific parameter as the overlap margin between each said interconnection line and each said connecting window.

14. The semiconductor integrated circuit design method according to claim 13 wherein determination of an overlap margin in said second step is carried out after subjecting said semiconductor integrated circuit to schematic placement/interconnection and finding the value of said specific parameter from the result of said schematic placement/interconnection and wherein said semiconductor integrated circuit design method further comprises, after said overlap margin determination, a step of correcting said schematic placement/interconnection according to said overlap margin.

15. The semiconductor integrated circuit design method according to claim 13 further comprising, at least before said second step, a step of subjecting said semiconductor integrated circuit to placement/interconnection wherein in said second step when the overlap margin between an interconnection line and a connecting window determined according to the result of said placement/interconnection disagrees with said working condition said placement/int, interconnection performed is corrected.

16. The semiconductor integrated circuit design method according to claim 13 wherein the length of each said interconnection line is predetermined and wherein in said first step an interconnection line length is included in said specific parameter and the representative value of a zone having an interconnection line length below a given value is set in such a way as to fall below the representative value of a zone having an interconnection line length above said given value.

17. The semiconductor integrated circuit design method according to claim 13 wherein the approximate width of each said interconnection line is predetermined and wherein in said first step an approximate interconnection line width is included in said specific parameter and the representative value of a zone having an approximate interconnection line width below a given value is set in such a way as to fall below the representative value of a zone having an approximate interconnection line width above said given value.

18. The semiconductor integrated circuit design method according to claim 13 wherein in said first step the current density of an electric current flowing in a plugging member is included in said specific parameter and wherein the representative value of a zone is set to increase as the current density of a plugging member of said zone increases.

19. The semiconductor integrated circuit design method according to claim 13 wherein in said first step said common representative values are set such that a zone in which an electric current flowing between an interconnection line and a plugging member is a continuous and unidirectional current, a zone in which said electric current is a unidirectional and pulse-like current, and a zone in which said electric current is a bidirectional current are assigned respective representative values which are set to decrease in that order.

20. The semiconductor integrated circuit design method according to claim 19 wherein it is determined whether the waveform of said unidirectional current is a pulse current or a continuous current and wherein in said first step a unidirectional current waveform is included in said specific parameter and the representative value of a zone in which said unidirectional current is a pulse current is set in such a way as to fall below the representative value of a zone in which said unidirectional current is a continuous current.

21. The semiconductor integrated circuit design method according to claim 13 wherein the direction of an electric current which flows between a plugging member and an interconnection line is predetermined and wherein in said first step an electric current direction is included in said specific parameter and the representative value of a zone in which an electric current flows from a plugging member to an interconnection line is set in such a way as to fall below the representative value of a zone in which an electric current flows in the opposite direction.

* * * * *